United States Patent
Morikita et al.

(10) Patent No.: US 7,488,689 B2
(45) Date of Patent: Feb. 10, 2009

(54) PLASMA ETCHING METHOD (75) Inventors: Shinya Morikita, Hillsboro, OR (US); Masaharu Sugiyama, Nirasaki (JP); Atsushi Kawabata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/290,481

(22) Filed: Dec. 1, 2005

(65) Prior Publication Data

US 2006/0118520 A1    Jun. 8, 2006

Related U.S. Application Data

(60) Provisional application No. 60/637,446, filed on Dec. 21, 2004.

(30) Foreign Application Priority Data

Dec. 7, 2004   (JP) ............... 2004-353976

(51) Int. Cl.
*H01L 21/302* (2006.01)
(52) U.S. Cl. ............... 438/706; 438/714; 438/719; 438/720
(58) Field of Classification Search ............... 438/706, 438/710, 712, 714, 719, 720; 134/1.1, 1.2, 134/1.3
See application file for complete search history.

(56) References Cited

U.S. PATENT DOCUMENTS

| | | | | |
|---|---|---|---|---|
| 5,236,868 A | * | 8/1993 | Nulman | 438/653 |
| 5,356,478 A | * | 10/1994 | Chen et al. | 134/1 |
| 5,705,428 A | * | 1/1998 | Liu et al. | 438/643 |
| 6,180,321 B1 | * | 1/2001 | Roh | 430/313 |
| 6,635,185 B2 | * | 10/2003 | Demmin et al. | 216/64 |
| 6,652,709 B1 | * | 11/2003 | Suzuki et al. | 156/345.41 |
| 2002/0014625 A1 | * | 2/2002 | Asami et al. | 257/57 |
| 2002/0060516 A1 | * | 5/2002 | Kawate et al. | 313/495 |
| 2002/0125213 A1 | * | 9/2002 | Yamazaki et al. | 216/67 |
| 2004/0074869 A1 | * | 4/2004 | Wang et al. | 216/63 |
| 2004/0082186 A1 | * | 4/2004 | Okamoto | 438/709 |
| 2004/0253828 A1 | * | 12/2004 | Ozawa et al. | 438/710 |
| 2006/0226119 A1 | * | 10/2006 | Kannan et al. | 216/67 |

FOREIGN PATENT DOCUMENTS

| | | |
|---|---|---|
| KR | 2000-0040062 | 7/2000 |
| KR | 2002-0053569 | 7/2002 |

* cited by examiner

*Primary Examiner*—Kin-Chan Chen
(74) *Attorney, Agent, or Firm*—Oblon, Spivak, McClelland, Maier & Neustadt, P.C.

(57) ABSTRACT

In a vacuum processing chamber, an etching is performed on an object to be processed having at least a mask layer formed in a predetermined pattern and a Ti layer, as a layer to be etched, formed under the mask layer. During the etching, a first plasma processing is carried out to etch the Ti layer by using a plasma of an etching gas containing a fluorine compound at an inner pressure of the chamber of 4 Pa or less. Subsequently, a second plasma processing for dry cleaning is performed by using a plasma of a cleaning gas after the first plasma processing is completed. At this time, a deposit containing a Ti compound produced during the plasma processing is removed.

9 Claims, 8 Drawing Sheets

PLASMA ETCHING METHOD

CROSS-REFERENCE TO RELATED APPLICATIONS

This document claims priority to Japanese Patent Application Number 2004-353976, filed Nov. 7, 2004 and U.S. Provisional Application No. 60/637,446, filed Dec. 21, 2004, the entire content of which are hereby incorporated by reference.

FIELD OF THE INVENTION

The present invention relates to a plasma etching method; and more particularly, to a plasma etching method for performing an etching on a metal film, such as Ti or the like, by using a plasma of a reactive gas.

BACKGROUND OF THE INVENTION

In a semiconductor device, a metal such as titanium (Ti) or the like is employed as, e.g., a wiring material, and also, a metallic silicide is used for reducing a parasitic resistance of a MOS transistor or the like. For example, in a MOS transistor manufacturing process, after a Ti film is formed on a gate electrode or a surface of a diffusion layer, it is silicided by heat-treatment and the unreacted Ti film is removed. As a technology for removing the Ti film formed on the substrate by an etching, there has been proposed a method for performing a dry etching by using a plasma of a $CF_4$ based etching gas (see, e.g., references 1 and 2).

Reference 1: Japanese Patent Laid-open Application No. S53-118372 (e.g., FIGS. 1 to 5)

Reference 2: Japanese Patent Laid-open Application No. S56-66040 (e.g., the claims)

In general, a high etching rate is preferable to improve a throughput and, even in case of a Ti film etching, a processing is required to be performed at a high etching rate. However, the aforementioned conventional technologies are totally silent on increasing the etching rate. For example, in the method of Reference 2, only an etching rate of about 30~40 nm/min is obtained, even though the etching is carried out after a pre-etching for a rapid start has been performed (see, FIG. 1 of reference 2). Hence, it cannot possibly response a recent high speed etching.

Meanwhile, in case when an etching is performed on the Ti film at a high rate by using a plasma of a CF based gas as described in the aforementioned References 1 and 2, a re-deposition of an etching residue, so-called a fence, may be generated. Such a phenomenon means that the etching residue such as Ti or the like is scattered due to a strong sputtering during the high speed etching to be deposited again on a photoresist or a side of other metal material. Since the fence causes a Ti contamination, it needs to be avoided as possible.

Further, while the Ti film is plasma etched, a large amount of deposits are produced in the chamber. These deposits cause a particle contamination, thereby hampering the fabrication of the reliable semiconductor device. Accordingly, it is necessary to consider a counter measure for the deposits in the chamber during the plasma etching of the Ti film.

SUMMARY OF THE INVENTION

It is, therefore, a primary object of the present invention to provide a plasma etching method capable of avoiding a fence generation, and at the same time, performing a Ti etching at a high etching rate. Further, it is another object of the present invention to provide a plasma etching method capable of suppressing a deposit generation in the chamber during the etching process, thereby preventing the particle contamination in advance.

For achieving the aforementioned objects, in accordance with the first aspect of the present invention, there is provided a plasma etching method for performing an etching in a vacuum processing chamber by using a plasma of an etching gas on an object to be processed, having at least a mask layer formed in a predetermined pattern and a Ti layer, as a layer to be etched, formed under the mask layer, to etch the Ti layer, wherein the etching is carried out at an inner pressure of the chamber of 4 Pa or less by using an etching gas containing a fluorine compound.

In the plasma etching method of the first aspect, it is preferable that the fluorine compound is $CF_4$. Further, it is preferable that the etching is carried out at an etching rate of 90~140 nm/min.

In accordance with the second aspect of the present invention, there is provided a plasma etching method for performing an etching in a vacuum processing chamber on an object to be processed having at least a mask layer formed in a predetermined pattern and a Ti layer, as a layer to be etched, formed under the mask layer, the method including: a first plasma processing step of etching the Ti layer by using a plasma of an etching gas containing a fluorine compound at an inner pressure of the chamber of 4 Pa or less; and a second plasma processing step of performing a dry cleaning by using a plasma of a cleaning gas after the first plasma processing is completed, wherein, in the second plasma processing step, a deposit containing a Ti compound produced during the first plasma processing is removed.

In the plasma etching method of the second aspect, the first and the second plasma processing step may be alternately repeatedly carried out. Further, the cleaning gas used in the second plasma processing step may be a gas containing a fluorine compound or oxygen. Here, the fluorine compound may be $NF_3$ or $CF_4$.

Further, it is preferable that the inner pressure of the chamber in the second plasma processing step is 6.7 Pa or less.

In accordance with the third aspect of the present invention, there is provided a control program, executed in a computer, for controlling a plasma processing apparatus such that the plasma etching method of the first or the second aspect is performed.

In accordance with the fourth aspect of the present invention, there is provided a computer readable storage medium storing therein a control program executed in a computer, wherein the control program controls a plasma processing apparatus used for the plasma etching method of the first or the second aspect.

In accordance with the fifth aspect of the present invention, there is provided a plasma etching apparatus including: a plasma supply source for producing a plasma; a processing vessel for defining a processing space in which an etching process is performed on an object to be processed by the plasma; a supporting member for mounting thereon the object to be processed in the processing vessel; a gas exhaust unit for depressurizing the processing vessel; a gas supply unit for supplying a gas into the processing vessel; and a control unit for controlling the plasma etching method of the first or the second aspect.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

Figure 1:
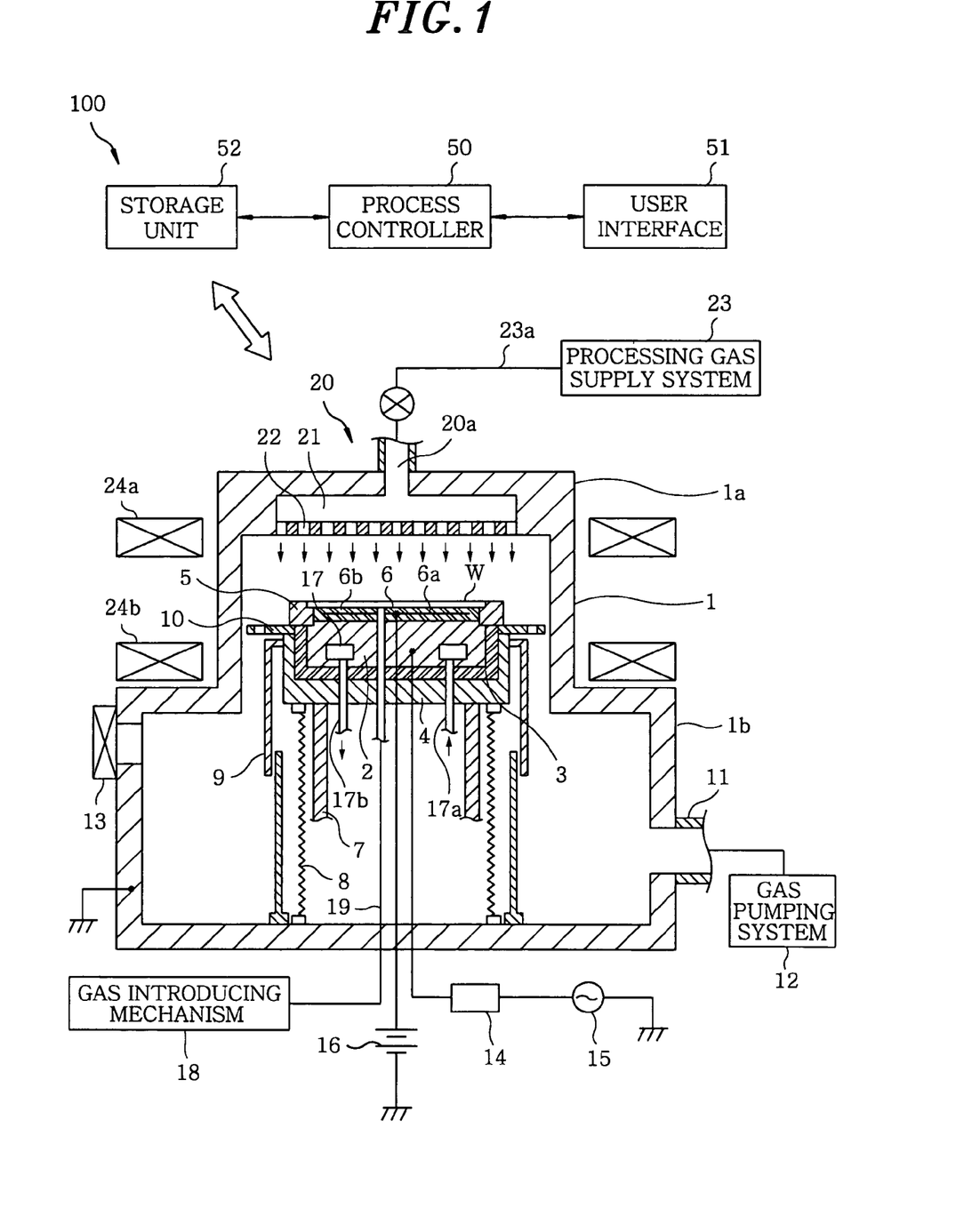
FIG. 1 describes a cross sectional view showing a schematic configuration of a magnetron RIE plasma etching apparatus for performing a method in accordance with the present invention.

FIG. 1 is a cross sectional view showing a schematic magnetron RIE type plasma etching apparatus 100 properly used for performing a method of the present invention. The etching apparatus 100 includes an airtight stepped cylindrical chamber (processing vessel) 1 having an upper portion 1a of a small diameter and a lower portion 1b of a large diameter, a wall portion of which is made of, e.g., aluminum.

Installed in the chamber 1 is a supporting table 2 for horizontally supporting a semiconductor wafer (hereinafter, referred to as a 'wafer') W of a silicon substrate, on which a Ti film is formed, as an object to be processed. The supporting table 2 made of, e.g., aluminum is supported by a conductive supporter 4 through an insulating plate 3. Further, a focus ring 5 made of, e.g., Si or quartz, is provided at an outer periphery of an upper portion of the supporting table 2. The supporting table 2 and the supporter 4 are configured to be elevated by a ball screw mechanism containing a ball screw 7; and a driving portion of a lower portion of the supporter 4 is covered with a stainless steel bellows 8. A bellows cover 9 is provided at an outer side of the bellows 8. Further, an evacuation plate 10 is provided outside the focus ring 5, and the chamber 1 is grounded.

A gas exhaust port 11 formed at a sidewall of the lower portion 1b of the chamber 1 is coupled to a gas pumping system 12. By operating a vacuum pump of the gas pumping system 12, an inside of the chamber 1 is depressurized to a predetermined vacuum level. Meanwhile, a gate valve 13 for opening and closing a loading/unloading port of the wafer W is provided at an upper sidewall of the lower portion 1b of the chamber 1.

To the supporting table 2, there is coupled through a matching unit 14 a first high frequency power supply 15 for producing a plasma, from which a high frequency power of a predetermined frequency is supplied to the supporting table 2. Meanwhile, a shower head 20 that will be described in detail later is provided above the supporting table 2 in parallel therewith to face each other; and the shower head 20 is grounded. Accordingly, the supporting table 2 and the shower head 20 serve as a pair of electrodes.

On a surface of the supporting table 2, there is provided an electrostatic chuck 6 for electrostatically adsorbing the semiconductor wafer W to be maintained thereon. The electrostatic chuck 6 is configured such that an insulator 6b has therein an electrode 6a, which is connected to a DC power supply 16. Further, while a voltage from the DC power supply 16 is applied to the electrode 6a, the wafer W is adsorbed by an electrostatic force, e.g., Coulomb force.

The supporting table 2 has therein a temperature control medium space 17. A temperature control medium is circulated by being introduced into the temperature control medium space 17 through an introducing line 17a and discharged therefrom through a discharge line 17b, so that a heat (hot heat and cold heat) is transferred to the wafer W through the supporting table 2, thereby controlling a processing surface of the wafer W to a desired temperature.

Further, even while the chamber 1 is exhausted by the gas pumping unit 12 to be kept in a vacuum state, a heat transfer medium gas is introduced at a predetermined pressure (back pressure) between the surface of the electrostatic chuck 6 and a backside of the wafer W through a gas supply line 19 by a gas introduction mechanism 18, such that the temperature of the wafer W is effectively controlled by the temperature control medium circulated in the temperature control medium space 17. As described above, with the introduction of the heat transfer medium gas, the heat from the temperature control medium is effectively transferred to the wafer W, thereby increasing a temperature control efficiency of the wafer W.

The shower head 20 is provided at a ceiling wall portion of the chamber 1 to face the supporting table 2. The shower head 20 has a plurality of gas discharge holes 22 in a bottom surface thereof, and a gas introduction unit 20a at an upper portion thereof. Moreover, a space 21 is formed in an inside thereof. The gas introduction unit 20a is connected to one end of a gas supply line 23a, and the other end of the gas supply line 23a is connected to a processing gas supply system 23 for supplying a processing gas such as an etching gas or a cleaning gas.

Such a processing gas from the processing gas supply system 23 is introduced into the space 21 of the shower head 20 through the gas supply line 23a and the gas introduction unit 20a, and then discharged through the gas discharge holes 22.

Figure 2:
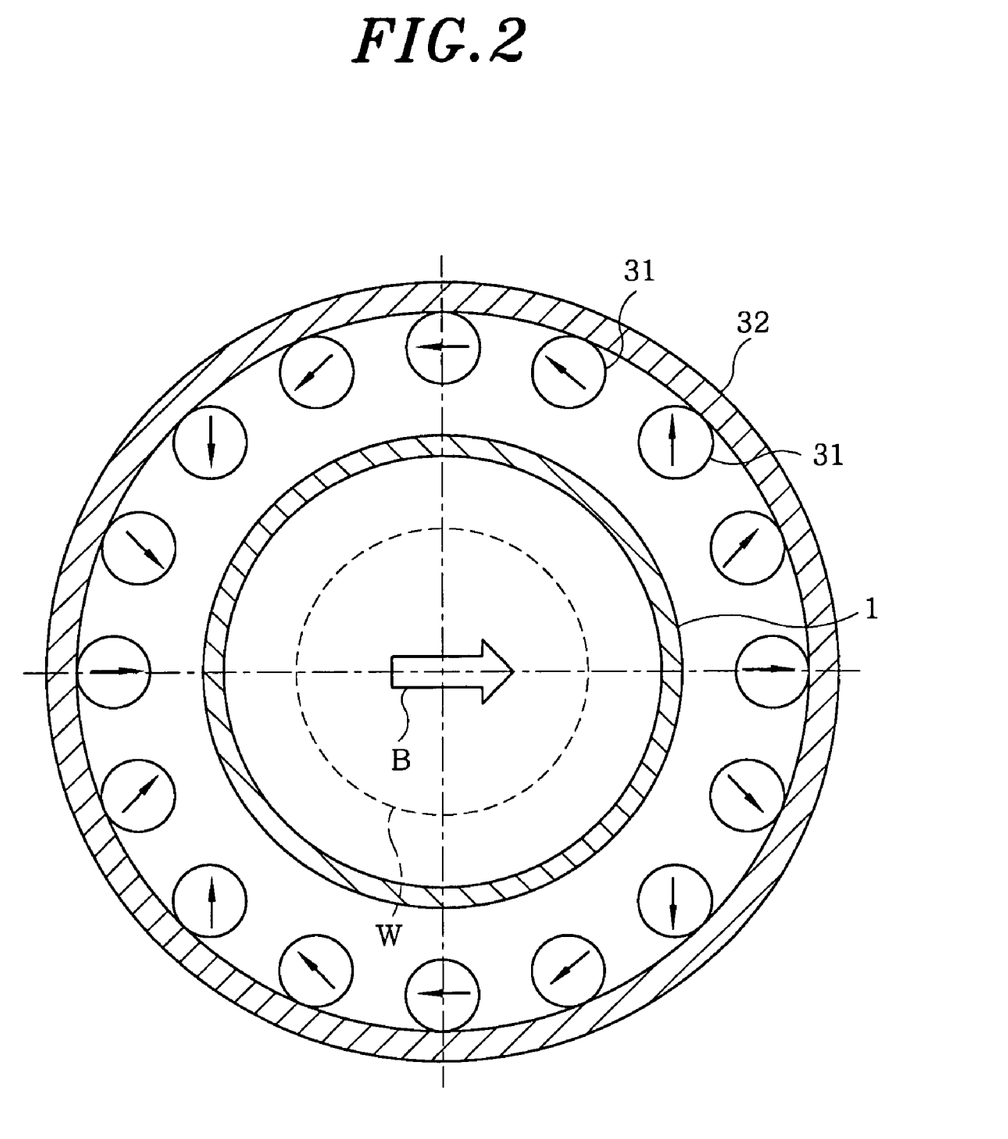
FIG. 2 offers a horizontal cross sectional view schematically showing dipole ring magnets arranged around the chamber of the apparatus shown in FIG. 1.

Meanwhile, a pair of the upper and lower dipole ring magnets 24a and 24b are concentrically disposed around the upper portion 1a of the chamber 1. As illustrated in a horizontal cross sectional view of FIG. 2, the dipole ring magnets 24a and 24b are configured such that a plurality of anisotropic segment columnar magnets 31 is attached to a ring shaped magnetic casing 32. For example, sixteen anisotropic segment columnar magnets 31 are circumferentially disposed in a ring shape. In FIG. 2, arrows shown in the anisotropic segment columnar magnets 31 indicate magnetization directions. As illustrated in FIG. 2, by arranging the magnetization directions of the plurality of anisotropic segment columnar magnets 31 to be slightly shifted in sequence, an uniform horizontal magnetic field B is formed along a single direction as a whole.

Figure 3:
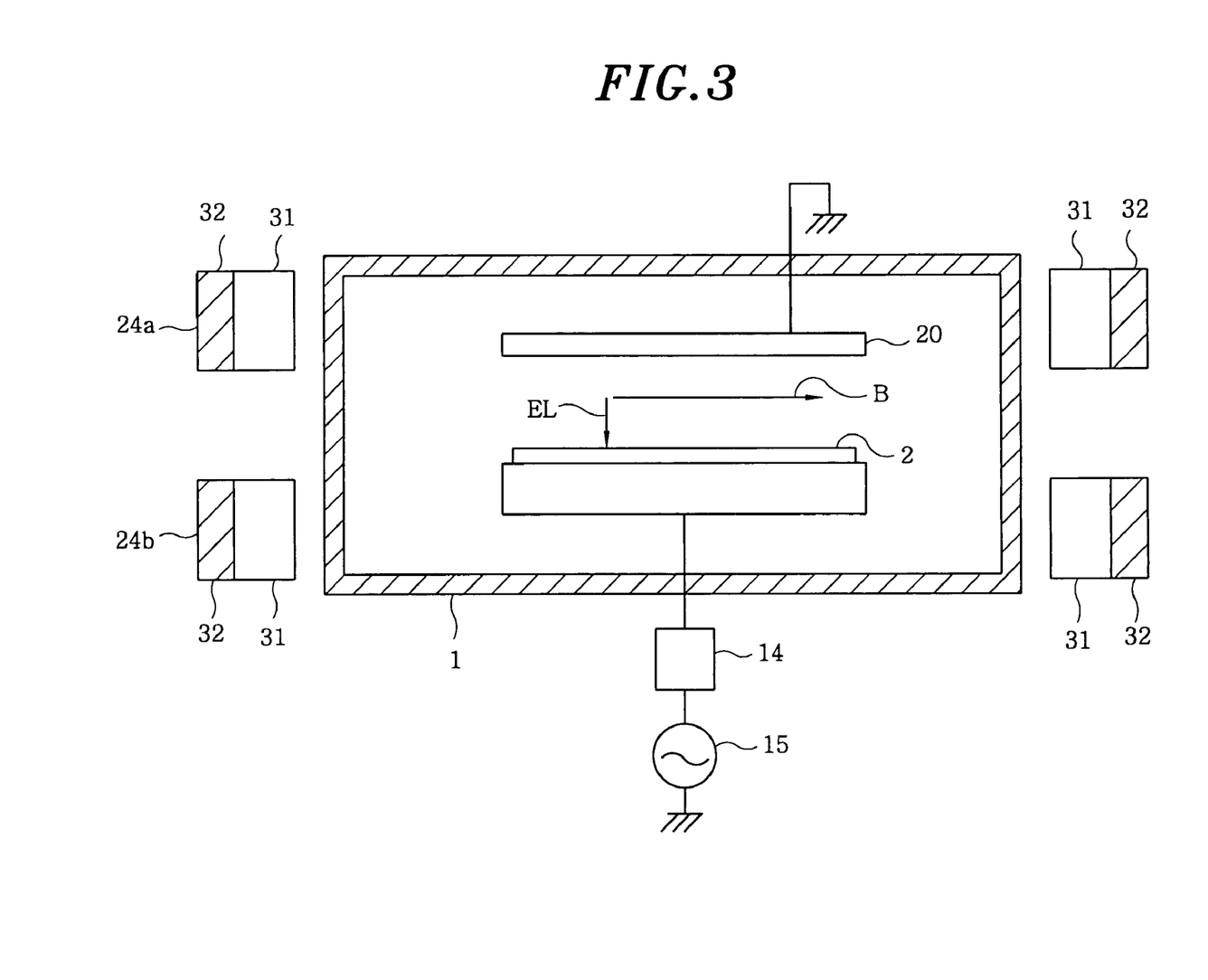
FIG. 3 sets forth a schematic view for explaining an electric field and a magnetic field formed in the chamber.

Therefore, as schematically illustrated in FIG. 3, a vertical electric field (EL) is formed by the electric power supplied from the first high frequency power supply 15 and a horizontal magnetic field B is formed by the dipole ring magnets 24a and 24b in the space between the supporting table 2 and the shower head 20, so that a magnetron discharge is generated by an orthogonal electromagnetic field thus formed. By this, a high-energy plasma of an etching gas is produced, and thus, the wafer W being etched therewith.

Further, respective configuration parts of the plasma etching apparatus 100 are connected to and controlled by a process controller 50 having a CPU. To the process controller 50, there is connected a user interface 51 including a keyboard used by a process manager for performing an input operation of a command to manage the plasma etching apparatus 100 and a display or the like for visualizing an operation status of the plasma etching apparatus 100.

Moreover, also connected to the process controller 50 is a storage unit 52 storing therein a control program for controlling various processes performed in the plasma etching apparatus 100 and a recipe wherein process condition data and the like are stored.

Meanwhile, if desired, a desired processing is performed in the plasma etching apparatus 100 under the control of the process controller 50 by retrieving a necessary recipe from the storage unit 52 in response to an instruction from the user interface 51, and executing it by the process controller 50. Further, as for the recipe, there may be used a recipe stored in a readable storage medium, e.g., a CD-ROM, a hard disk, a flexible disk, a non-volatile memory or the like, or a recipe transmitted from other devices available all the time through, e.g., a dedicated line.

In the following, a plasma etching method for the plasma etching apparatus 100 as configured above in accordance with the first embodiment of the present invention will be described with reference to FIGS. 4A and 4B.

First, the gate valve 13 shown in FIG. 1 is opened, and a wafer W is loaded into the chamber 1 to be mounted on the supporting table 2; the supporting table 2 is elevated to a position as shown in FIG. 1; and an inside of the chamber 1 is exhausted through the gas exhaust port 11 by the vacuum pump of the gas pumping system 12. In such a state, the wafer W is formed as illustrated in FIG. 4A, wherein a $SiO_2$ layer 102 of an insulating oxide film, a Ti layer 103 as a layer to be etched and a mask layer 104 are laminated on a Si substrate 101. The mask layer 104 is not specifically limited as long as it has an etching selectivity with respect to the Ti layer 103. For example, there may be used as the mask layer a photoresist, a hard mask formed of a metal or the like, an overlying layer formed through other processing, or the like. Further, the mask layer 104 is formed in a predetermined pattern.

Further, a processing gas containing an etching gas and a dilution gas is introduced from the processing gas supply system 23 into the chamber 1 at a predetermined flow rate. Under the condition that a pressure in the chamber 1 is 4 Pa (30 mTorr) or less and a temperature of the wafer W (supporting table 2) is in the range of 50~80° C., a high frequency power from the first high frequency power supply 15 is supplied to the supporting table 2. The high frequency power for producing a plasma is preferably, e.g., 2000 W or higher, and more preferably, about 3000~5000 W. At this time, a predetermined voltage is applied to the electrode 6a of the electrostatic chuck 6 from the DC power supply 16, so that the wafer W is adsorbed on the electrostatic chuck 6 to be maintained thereon by, e.g., Coulomb force; and at the same time, a high frequency electric field is formed between the shower head 20 as an upper electrode and the supporting table 2 as a lower electrode. Since the horizontal magnetic field B has been formed by the dipole ring magnets 24a and 24b between the shower head 20 and the supporting table 2, an orthogonal electromagnetic field is formed in the processing space between the electrodes where the wafer W is present, and a magnetron discharge is generated due to an electron drift produced by the orthogonal electromagnetic field. Further, the wafer W is etched by a plasma of the etching gas, which is produced by the magnetron discharge. In a conventional etching, a gas pressure in the chamber 1 is set high so that a sufficient amount of radicals as well as charged particles of ions and electrons are generated to efficiently improve an etching rate. Further, if the pressure is low, sputtering becomes stronger and a fence is likely to be generated. Therefore, in the conventional etching, a relatively high pressure condition of 6.7 Pa (50 mTorr) or higher is employed. However, in the present embodiment, the low pressure condition of, particularly, 4 Pa or less (i.e. in the range of 0~4 Pa) as described hereinafter is employed during the plasma etching of the Ti layer 103, so that the fence generation is prevented and the high speed etching of, e.g., 90~140 nm/min can be realized.

In the present embodiment using the RIE plasma generation mechanism, since the high frequency power is applied to the supporting table 2, as the lower electrode, for mounting thereon the wafer W, the plasma can be formed right above the object to be processed. Further, the etching is carried out while the magnetic field perpendicular to the electric field is formed between the electrodes, so that electrons move along spiral paths to be likely to collide with gas molecules, and hence, a high plasma density is realized right above the object to be processed. In this way, the etching can be carried out further rapidly.

As for the processing gas used in the first etching process, it is preferable that a fluorine compound containing gas of a high reactivity is employed to perform a high speed etching on the wafer W. Here, as the fluorine compound, there may be enumerated, e.g., $CF_4$, $C_3F_8$, $SF_6$, $S_2F_{10}$, $CHF_3$, $CH_2F_2$, $C_4F_8$ and the like. Further, a rare gas, e.g., Ar, Xe, Kr or the like, or a nonreactive gas such as $N_2$ or the like may be used with the fluorine compounds.

Further, between the surface of the electrostatic chuck 6 and the backside of the wafer W, there is introduced a heat transfer medium gas, for effectively supplying a heat (hot heat or cold heat) to the wafer W, through the gas supply line 19 by the gas introduction mechanism 18 at a predetermined pressure (back pressure). For example, e.g., He or the like may be used as the heat transfer medium gas.

A frequency and an output of the first high frequency power supply 15 for producing a plasma are properly set to generate a desired plasma. It is preferable that the frequency is 10 MHz or higher to increase the plasma density right above the wafer W.

The dipole ring magnets 24a and 24b form magnetic fields in the processing space between the supporting table 2 and the shower head 20 as the opposite electrodes to increase the plasma density right above the wafer W; and, for an effective effect, the magnets preferably have an intensity capable of forming a magnetic field of 1000 μT (100G) or higher in the processing space. The plasma density is increased, as the magnetic field gets stronger. However, it is preferable to set the magnetic field at 100000 μT (1 kG) or less for safety.

Figure 4A:
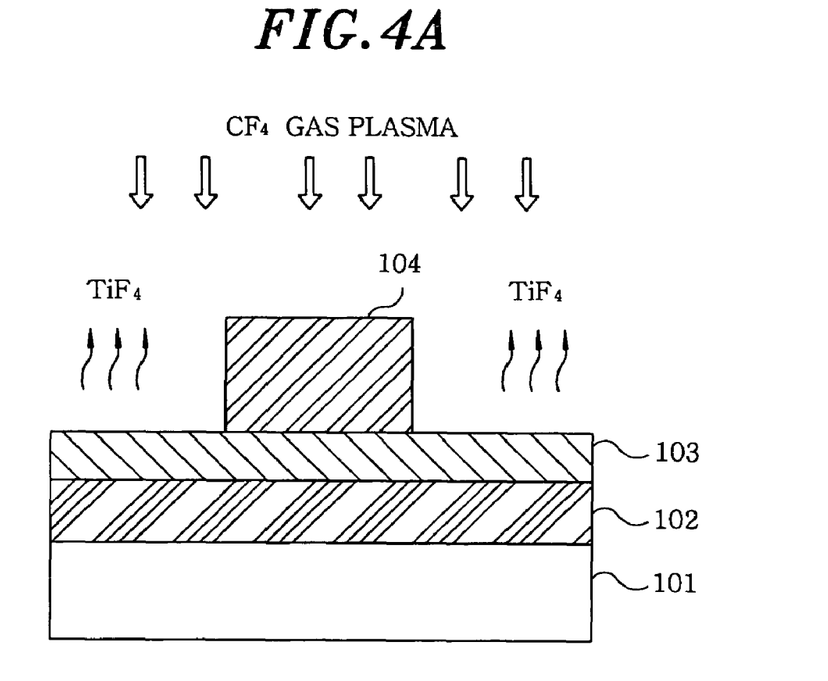
FIG. 4A presents a sequence of a plasma etching method in accordance with a first embodiment of the present invention.
Figure 4B:
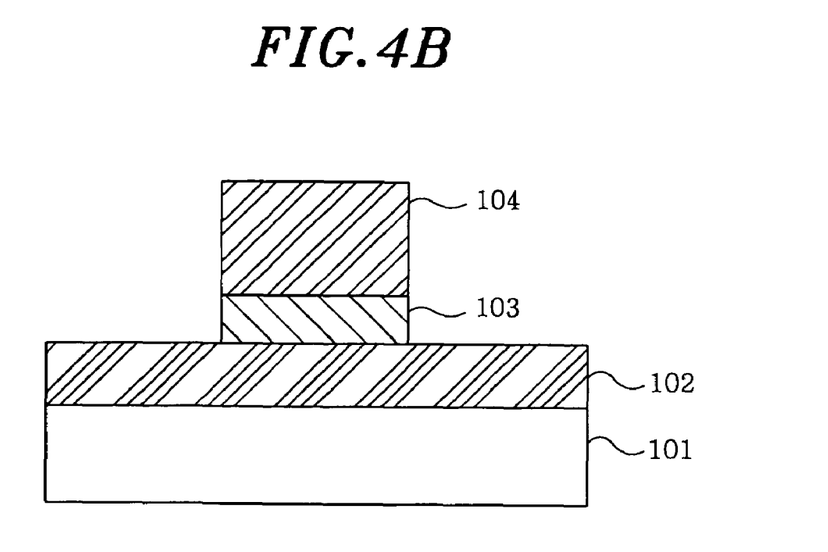
FIG. 4B shows a state after an etching process has been completed.

As illustrated in FIG. 4A, the etching is performed on the Ti layer 103 by, e.g., a $CF_4$ gas plasma, in the etching process. At this time, in accordance with the method of the present invention, it is possible to perform the etching at a high etching rate of, e.g., 90~140 nm/min. In case the plasma etching process is carried out at the low pressure of 4 Pa or less, Ti forming the Ti layer 103 becomes $TiF_4$ to be evaporated, due to a low vapor pressure thereof. By such a low pressure etching mechanism, the fence generation is prevented. Further, Ti forming the Ti layer 103 is removed from the $SiO_2$ layer 102 by the etching, except regions masked by the mask layer 104. A residual Ti layer 103 is patterned to have the identical pattern to the mask layer 104, as illustrated in FIG. 4B.

Here, an experiment result capable of confirming the effect of the present invention will be described.

By using the plasma etching apparatus 100 having the same configuration as that in FIG. 1, the plasma etching was carried out on the wafer W having the Ti layer 103 as shown in FIG. 4A by using $CF_4$ and Ar as an etching gas, under following conditions.

<Experiment 1: Condition 1>

Magnetic field intensity=12000 μT (120G) gradient magnet;

Magnetic field inclination=8.53 deg.;

Inner pressure of the chamber 1=4 Pa (30 mTorr);

High frequency power=4000 W;

$CF_4$/Ar flow rate=300/600 ml/min (sccm);

Distance between the upper and the lower electrode (i.e., distance from the bottom surface of the shower head 20 to the top surface of the supporting table 2; this is same hereinafter) =40 mm;

He back pressure (central portion/edge portion)=1333/3332.5 Pa (10/25 Torr);

Temperature of the shower head 20=60° C.

Temperature of the sidewall of the chamber 1=60° C.

Temperature of the supporting table 2=50° C.

Processing time=53.7 seconds

<Experiment 2: Condition 2>

The plasma etching was carried out under the same condition as in Experiment 1, except that the inner pressure of the chamber was 6.7 Pa and the processing time was 94.8 seconds.

After the plasma etching process was terminated, the respective wafers W of Experiments 1 and 2 were observed by a scanning electron microscope (SEM). As a result, in case of Experiment 2, a longitudinally stripped fence was observed at the sidewall of the mask layer 104, even though the etching process was performed at a high pressure wherein sputtering force is weaker compared with Experiment 1. In contrast with this, in case of Experiment 1, the fence generation was not observed (indications of all results are omitted).

Figure 5:
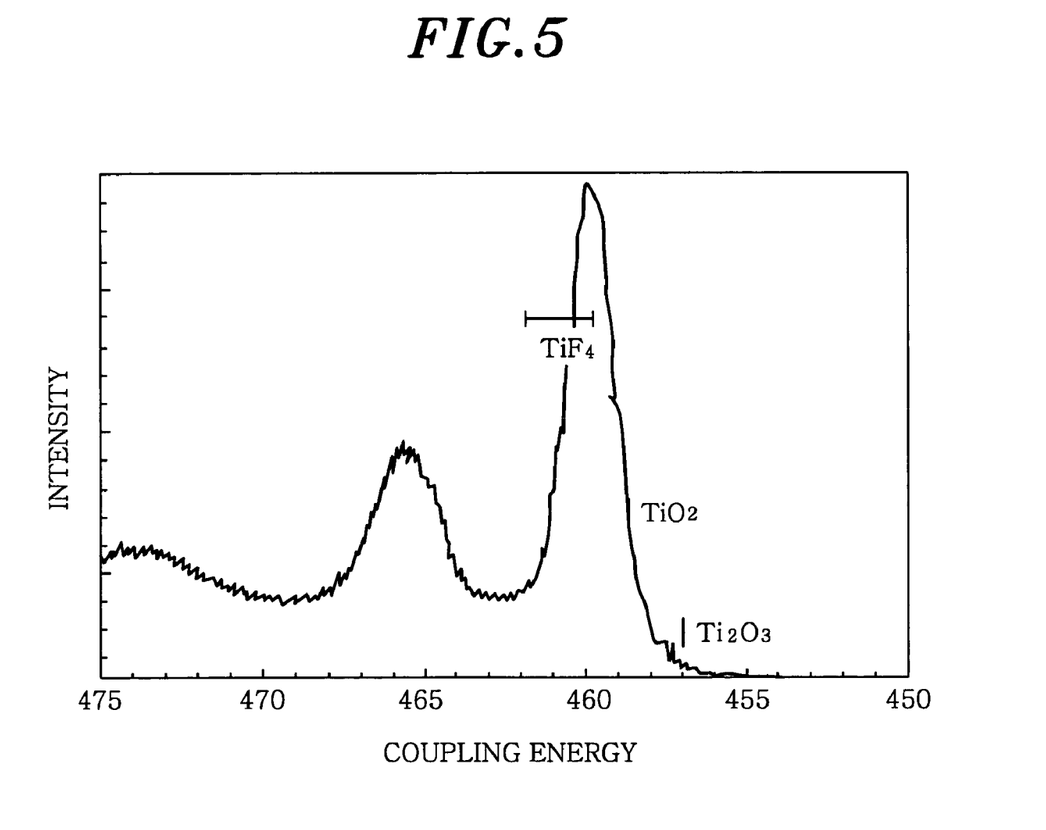
FIG. 5 is a graph showing a waveform separation result by an XPS analysis on a deposit in the chamber after the plasma etching process has been completed.

Further, as a result of an XPS analysis on the deposit in the chamber 1 after the etching of Condition 1, a Ti peak was detected. In FIG. 5, there is illustrated a waveform separation result on the Ti peak. From FIG. 5, it was proved that most Ti contained in the deposit exist as $TiF_4$.

In Experiment 2 of the 6.7 Pa high pressure processing, the etching rate was high as 140 nm/min, but the fence was generated. From such results, it was confirmed that the increase in the etching rate and the fence suppression are in a trade-off relationship, which is a unique phenomenon in case when the Ti layer 103 is etched by the plasma of the fluorine containing gas. Contrary to this, in Experiment 1, it was possible to realize the high speed etching at a sufficiently practical etching rate of 90 nm/min, while preventing the fence generation.

As described above, by performing the etching process under the low pressure condition of 4 Pa or less by using the plasma of the fluorine containing gas, Ti forming the Ti layer 103 is changed to $TiF_4$, which is evaporated to be removed. In accordance with the etching method, it can be secured that the generation of the fence, i.e., Ti deposits to the photoresist or other metal film by the sputtering, is prevented.

Hereinafter, there will be described a plasma etching method in accordance with a second embodiment of the present invention, wherein a cleaning process of the chamber 1 is added to the plasma etching method in accordance with the aforementioned embodiment. When the plasma etching process in accordance with the first embodiment is performed, a large amount of deposits are produced in the chamber 1. As a result of the XPS analysis on these deposits, it was found that $TiF_4$ and CF based compounds exist together. The powder deposits are adhered to parts around the wafer W, particularly, to the upper ceiling plate (a member disposed at a lower portion of the shower head 20 of FIG. 1), resulting in particles. To that end, a dry cleaning process in addition to the plasma etching process is performed to realize a stable plasma etching process.

Figure 6:
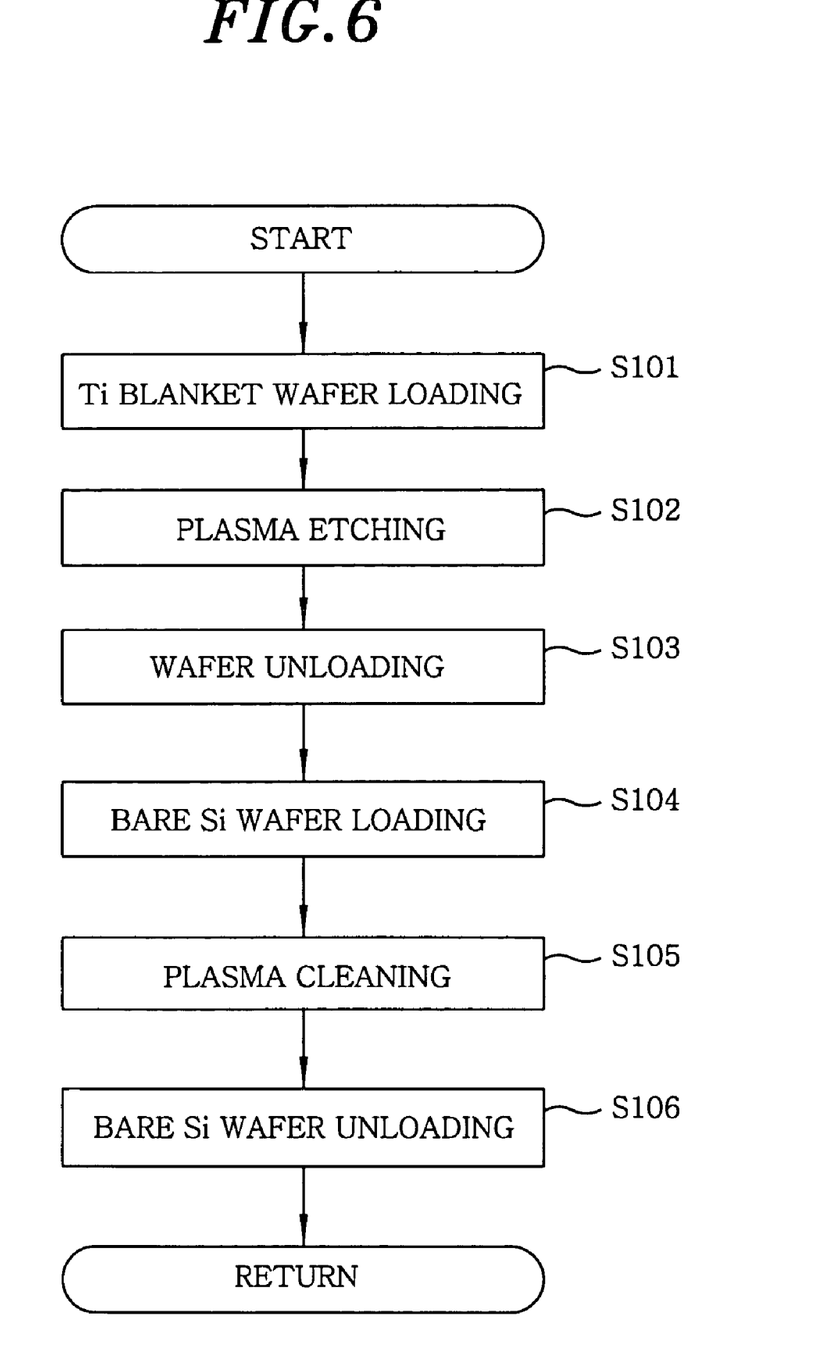
FIG. 6 provides a flowchart showing a sequence of a plasma etching method in accordance with a second embodiment of the present invention.

FIG. 6 is a flowchart showing a processing sequence of the plasma etching method in accordance with the second embodiment. First, a Ti blanket wafer having thereon the Ti layer 103 is loaded into the chamber 1 in step S101; and the plasma etching process is carried out in step S102. The plasma etching process in steps S101 and S102 is performed in the same manner as in the aforementioned first embodiment.

After the plasma etching process is completed, in step S103, a desired processing such as a pressure control is carried out after the etching, and then, the gate valve 13 of FIG. 1 is opened to unload the wafer W from the chamber 1. Subsequently, a bare Si wafer is loaded into the chamber 1 in step S104. The bare Si wafer means a clean wafer on which any films are not formed.

In step S105, the plasma cleaning process is performed on the bare Si wafer. As for a processing gas used in the plasma cleaning, there may be properly used a gas containing a fluorine compound, e.g., $NF_3$, $CF_4$ or the like, $O_2$ and the like. Further, the processing gas may also contain a rare gas, e.g., Ar, Xe, Kr, He or the like, and a nonreactive gas such as $N_2$ or the like. A pressure of the cleaning process in step S105 is preferably 6.7 Pa or less (i.e., in the range of 0~6.7 Pa), more preferably, 4 Pa or less, and most preferably, 2 Pa or less, to increase a cleaning efficiency. Further, the cleaning process temperature is preferably 50° C. or higher, and more preferably, 80° C. or higher.

Here, there will be described an examination result on an influence of the processing gas on a cleaning effect depending on the kind thereof. Three kinds of processing gases, i.e., a gaseous mixture of $CF_4$/Ar, a gaseous mixture of $NF_3$/Ar, and an $O_2$ gas (single), were subjected to the cleaning under following conditions; and the thickness of the deposit on the upper ceiling plate was measured.

$CF_4$/Ar Gas:

Magnetic field intensity=12000 μT (120G) gradient magnet;

Magnetic field inclination=8.53 deg.;

Inner pressure of the chamber 1=4 Pa (30 mTorr);

High frequency power=4000 W;

$CF_4$/Ar flow rate=300/600 ml/min (sccm);

Distance between the upper and the lower electrode=40 mm;

He back pressure (central portion/edge portion)=1333/3332.5 Pa (10/25 Torr);

Temperature of the shower head 20=80° C.;

Temperature of the sidewall of the chamber 1=60° C.;

Temperature of the supporting table 2=50° C.; and

Processing time=90 seconds.

NF$_3$/Ar Gas:

It was carried out under the same condition as in the case of the CF$_4$/Ar gas, except that NF$_3$/Ar gas was used.

O$_2$ Gas:

It was carried out under the same condition as in the case of the CF$_4$/Ar gas, except that the O$_2$ flow rate is 90 ml/min (sccm) and the magnetic field inclination is 12.88 deg.

The deposits are measured at following points: the central portion C and the outermost edge portion E3 of the upper ceiling plate; and the intermediate portion M, the first edge portion E1 and the second edge portion E2, which are spacedly disposed in that order from the central portion C between the central portion C and the outermost edge portion E3 (this is the same hereinafter). The results thereof are shown in FIG. 7.

Figure 7:
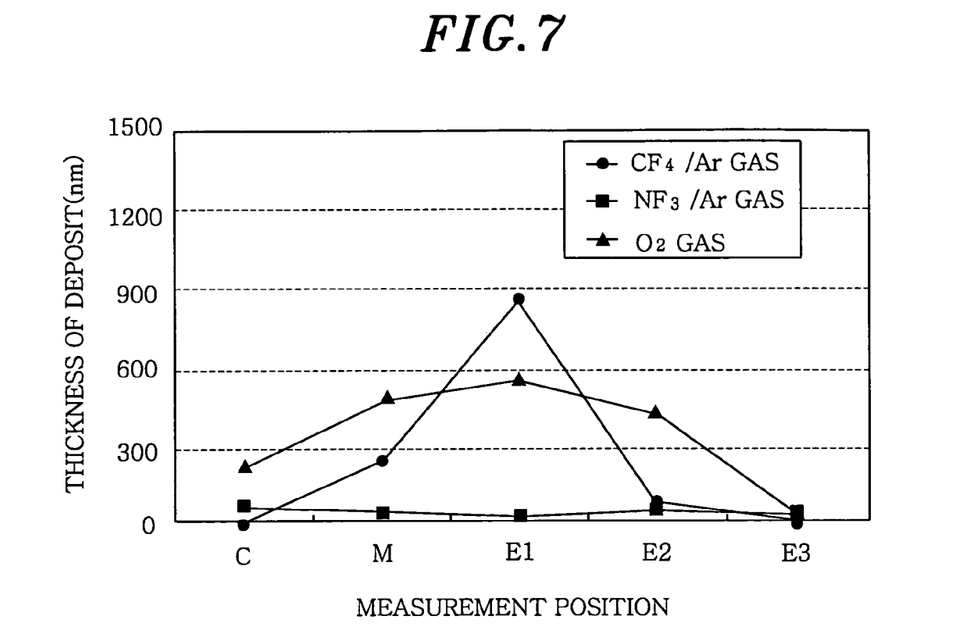
FIG. 7 offers a graph showing a measurement result on a thickness of a deposit on an upper ceiling plate after a cleaning process has been completed, as a function of a processing gas.

As can be seen from FIG. 7, the most effective gas is NF$_3$/Ar; O$_2$ functions to clean substantially the entire upper ceiling plate; and CF$_4$/Ar is inferior to NF$_3$/Ar and O$_2$ gases in the cleaning effect at the first edge portion E1. From these results, a satisfactory cleaning effect can be expected by performing a single processing using, e.g., NF$_3$/Ar gas; or performing the CF$_4$/Ar gas processing with the O$_2$ gas processing, i.e., performing the O$_2$ gas processing after the CF$_4$/Ar gas processing.

Subsequently, in FIG. 8, there will be described an examination result on an influence of a processing pressure on the cleaning effect. A cleaning was performed by using only O$_2$ gas (single) under following conditions, as a function of a pressure (a gas flow rate); and the thickness of the deposit on the upper ceiling plate was measured.

Cleaning Condition:

Magnetic field intensity=12000 μT (120G) gradient magnet;

Magnetic field inclination=12.88 deg.;

Inner pressure of the chamber 1=4 Pa (30 mTorr) or 2 Pa (15 mTorr);

High frequency power=4000 W;

O$_2$ flow rate=900 ml/min or 450 ml/min (sccm);

Distance between the upper and the lower electrode=40 mm;

He back pressure (central portion/edge portion)=1333/3332.5 Pa (10/25 Torr);

Temperature of the shower head 20=80° C.;

Temperature of the sidewall of the chamber 1=60° C.;

Temperature of the supporting table 2=50° C.; and

Processing time=90 seconds

Figure 8:
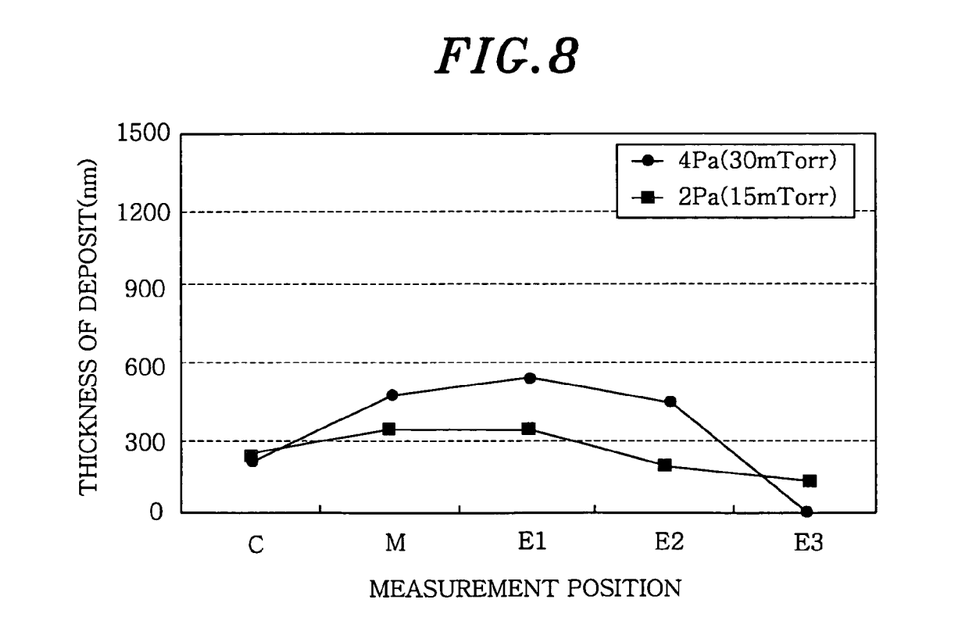
FIG. 8 describes a graph showing a measurement result on a thickness of a deposit on the upper ceiling plate after the cleaning process has been completed, as a function of a pressure.

From FIG. 8, it can be noted that, by decreasing the inner pressure of the chamber from 4 Pa (30 mTorr) to 2 Pa (15 mTorr), the cleaning effect is improved since the film thickness of the deposit becomes thinner in substantially the entire upper ceiling plate.

In the processing sequence shown in FIG. 6, a desired processing such as a pressure control is performed after the cleaning process, and then, the gate valve 13 shown in FIG. 1 is opened to unload the wafer W from the chamber 1 in step S106.

Subsequently, a processing on a new Ti blanket wafer is performed by returning to step S101. The cleaning may be carried out after any number (e.g., one lot) of wafers W are etched; but preferably, the plasma cleaning in the chamber 1 is carried out every time when one Ti blanket wafer is plasma etching processed, as illustrated in FIG. 6. In this way, it is possible to remove the deposits from the chamber 1, and perform the plasma etching process stably while preventing the particle contamination.

Figure 9:
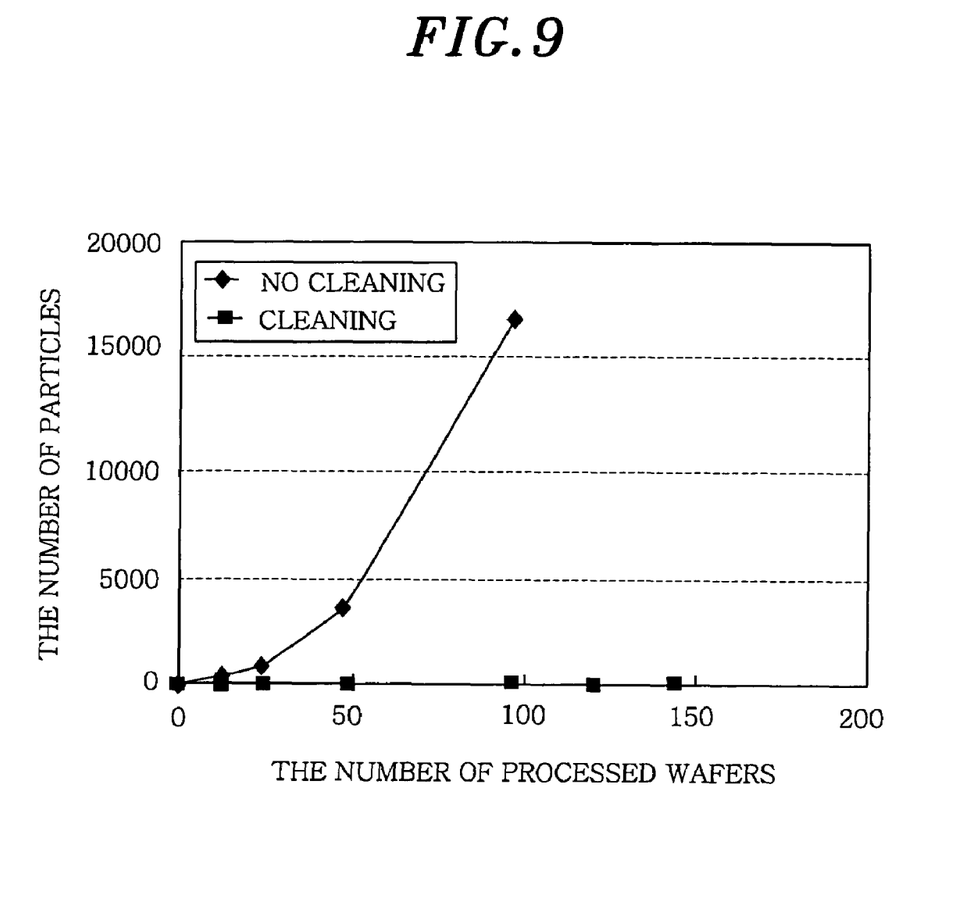
FIG. 9 is a graph showing a relationship between the numbers of processed wafers and particles in the plasma etching.

FIG. 9 shows a measurement result on the number of particles of 0.5 μm or greater by using a particle counter, in case where the Ti blanket wafer is subjected to the plasma etching process under following conditions. Moreover, for comparison, a result in case where the cleaning is not carried out will be described as well.

Etching Condition:

Magnetic field intensity=12000 μT (120G) gradient magnet;

Magnetic field inclination=8.53 deg.;

Inner pressure of the chamber 1=4 Pa (30 mTorr);

High frequency power=4000 W;

CF$_4$/Ar flow rate=300/600 ml/min (sccm);

Distance between the upper and the lower electrode=40 mm;

He back pressure (central portion/edge portion)=1333/3332.5 pa (10/25 Torr);

Temperature of the shower head 20=60° C.;

Temperature of the sidewall of the chamber 1=60° C.;

Temperature of the supporting table 2=50° C.; and

Processing time=90 seconds

Cleaning Condition:

Magnetic field intensity=12000 μT (120G) gradient magnet;

Magnetic field inclination=8.53 deg.;

Inner pressure of the chamber 1=4 Pa (30 mTorr);

High frequency power=4000 W;

NF$_3$/Ar flow rate=300/600 ml/min (sccm);

Distance between the upper and the lower electrode=40 mm;

He back pressure (central portion/edge portion)=1333/3332.5 Pa (10/25 Torr);

Temperature of the shower head 20=80° C.;

Temperature of the sidewall of the chamber 1=60° C.;

Temperature of the supporting table 2=50° C.; and

Processing time=90 seconds

As can be seen from FIG. 9, in the case where the plasma cleaning is not performed, the number of particles is increased as the number of Ti blanket wafers to be processed increases. In contrast with this, in the case where the plasma cleaning is performed for every wafers, there is generated substantially no particles so that a reliable semiconductor device can be manufactured.

Heretofore, the embodiments in accordance with the present invention have been described, but the present invention may be variously modified without being limited to the aforementioned embodiments.

For example, in the above embodiments, the dipole ring magnet is used as a magnetic field formation means in the magnetron RIE plasma etching apparatus, but the present invention is not limited thereto. Various plasma etching apparatus 100 including a capacitively coupled or an inductively coupled plasma etching apparatus, which do not use the magnetic field, may be used as long as they can produce a plasma at the pressure range of the present invention.

Further, although, in the aforementioned embodiments, the etching of the Ti layer 103 based on the pattern of the mask 104 has been exemplified; but the present invention may be applied to the entire Ti layer etching without being limited thereto.

In accordance with a plasma etching method of the present invention, it is possible to etch a Ti film at a high etching rate by using a gas containing a fluorine compound as an etching gas and performing a plasma etching under a low pressure condition, and at the same time, effectively prevent a fence generation.

Further, it is possible to suppress deposits from being deposited in a chamber by performing a plasma cleaning process under a specified condition as well as a plasma etching process, so that a particle contamination is prevented in advance, thereby improving a reliability of a semiconductor device.

While the invention has been shown and described with respect to the preferred embodiments, it will be understood by those skilled in the art that various changes and modifications may be made without departing from the scope of the invention as defined in the following claims.

What is claimed is:

1. A plasma etching method comprising the step of:
   performing an etching on an object to be processed in a vacuum processing vessel by using a plasma of an etching gas including a fluorine compound and either a rare gas or a nonreactive gas, the object to be processed having at least a patterned mask layer and a Ti layer formed under the mask layer,
   wherein the etching is carried out at an etching rate of 90-140 nm/min and the etching is carried out to etch the Ti layer at an inner pressure of the vessel of 4 Pa or less to prevent a fence generation.

2. The plasma etching method of claim 1, wherein the fluorine compound is $CF_4$.

3. The plasma etching method of claim 1, wherein the etching gas includes the fluorine compound and $N_2$.

4. A plasma etching method for performing an etching on an object to be processed in a vacuum processing vessel, the object to be processed having at least a patterned mask layer and a Ti layer formed under the mask layer, the method comprising:
   a first plasma processing step of etching the Ti layer by using a plasma of an etching gas including a fluorine compound and either a rare gas or a nonreactive gas at an etching rate of 90-140 nm/min and an inner pressure of the vessel of 4 Pa or less to prevent a fence generation; and
   a second plasma processing step of performing a dry cleaning by using a plasma of a cleaning gas after the first plasma processing is completed,
   wherein, in the second plasma processing step, deposit containing a Ti compound produced during the first plasma processing is removed.

5. The plasma etching method of claim 4, wherein the first and the second plasma processing step are alternately repeatedly carried out.

6. The plasma etching method of claim 4, wherein the cleaning gas used in the second plasma processing step contains a fluorine compound or oxygen.

7. The plasma etching method of claim 6, wherein the fluorine compound contained in the cleaning gas is $NF_3$ or $CF_4$.

8. The plasma etching method of claim 6, wherein the inner pressure of the vessel in the second plasma processing step is 6.7 Pa or less.

9. The plasma etching method of claim 4, wherein the etching gas includes the fluorine compound and $N_2$.

* * * * *